(12) United States Patent
Lippitt, III et al.

(10) Patent No.: US 8,431,463 B2
(45) Date of Patent: Apr. 30, 2013

(54) CAPACITOR CONTACT FORMED CONCURRENTLY WITH BOND PAD METALLIZATION

(75) Inventors: Maxwell Walthour Lippitt, III, Rockwall, TX (US); Stephen Arlon Meisner, Allen, TX (US); Lee Alan Stringer, Frisco, TX (US); Stephen Fredrick Clark, Plano, TX (US); Fred Percy Debnam, II, Garland, TX (US); Byron Lovell Williams, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 260 days.

(21) Appl. No.: 12/538,530

(22) Filed: Aug. 10, 2009

(65) Prior Publication Data
US 2010/0032803 A1 Feb. 11, 2010

Related U.S. Application Data

(60) Provisional application No. 61/087,229, filed on Aug. 8, 2008.

(51) Int. Cl.
*H01L 21/20* (2006.01)
(52) U.S. Cl.
USPC .................................. 438/386; 257/E21.477

(58) Field of Classification Search .................. 257/534, 257/E21.477; 438/396, 387, 386, 637
See application file for complete search history.

(56) References Cited

U.S. PATENT DOCUMENTS

| | | | | |
|---|---|---|---|---|
| 6,117,747 | A  * | 9/2000 | Shao et al. | 438/396 |
| 6,746,914 | B2 * | 6/2004 | Kai et al. | 438/253 |
| 7,902,033 | B2 | 3/2011 | Williams et al. | |
| 2003/0001284 | A1* | 1/2003 | List et al. | 257/778 |
| 2005/0287758 | A1* | 12/2005 | Kim | 438/393 |
| 2007/0228573 | A1* | 10/2007 | Matsunaga et al. | 257/758 |
| 2011/0156209 | A1 | 6/2011 | Williams et al. | |

* cited by examiner

*Primary Examiner* — Shaun Campbell
(74) *Attorney, Agent, or Firm* — Alan A. R. Cooper; Wade J. Brady, III; Frederick J. Telecky, Jr.

(57) ABSTRACT

A method is disclosed for passivating and contacting a capacitor in an IC above a top level of interconnect metallization, without adding process steps. Passivation is accomplished by a dielectric layer, part of the IC protective overcoat, deposited directly on the capacitor, overlapping the electrode edges. Contact is made to the top electrode of the capacitor by etching small capacitor vias during a bond pad via etch process, followed by depositing and patterning bond pad metal in the capacitor vias to connect the top electrode to other circuit elements in the IC. The top electrode thickness is increased to accommodate the bond pad via etch process.

26 Claims, 6 Drawing Sheets

CAPACITOR CONTACT FORMED CONCURRENTLY WITH BOND PAD METALLIZATION

This application is a non-provisional of Application No. 61/087,229 filed Aug. 8, 2008, the entirety of which is incorporated herein by reference.

BACKGROUND

This invention relates to the field of integrated circuits; and, more particularly, to integrated circuits including capacitors.

Integrated circuits (ICs) may incorporate capacitors above the top level of interconnect metal. Passivating the electrodes and making contact to the electrodes while minimizing IC fabrication cost and complexity presents a challenge. A common connection scheme is to use bond pad metallization to contact the top of the capacitor. The capacitor is e.g., at a higher level than the top interconnect metal, thus presenting the bond pad via etch process with more than one target depth. Adding a photolithographic cycle to separately form capacitor interconnect vias increases IC fabrication costs and offsets the advantage of incorporating the capacitor on the IC.

SUMMARY

The invention provides a method of passivating and contacting a capacitor in an integrated circuit (IC) which is positioned above a top level of interconnect metallization of the IC.

In a described embodiment, a layer of dielectric is formed on the top surface of the capacitor which overlaps and passivates the edges of the capacitor electrodes. Capacitor vias, which are significantly smaller than the bond pad vias, are etched through the dielectric layer to the top electrode during the bond pad via etch process. The bond pad via etch process exhibits a lower etch rate in the smaller capacitor vias than in the larger bond pad vias. The top electrode thickness is adjusted to accommodate the bond pad via etch process without damaging the capacitor dielectric layer. Bond pad metallization is used to make electrical contact to a top electrode of the capacitor.

An advantage of the invention is that the capacitor is passivated and contacted without adding cost or complexity, such as additional photolithographic operations, to the IC fabrication process sequence.

DETAILED DESCRIPTION OF EXAMPLE EMBODIMENTS

The challenge of passivating and making electrical contact to a capacitor in an integrated circuit (IC) which is positioned above a top metal interconnect level, is addressed by an example embodiment, which provides a cap layer of protective overcoat dielectric above the capacitor, and a bond pad via etch process which exhibits different etch rates to target vias of different depths. Bond pad metallization is used to make electrical contact to a top electrode of the capacitor.

FIGS. 1A-1G illustrate an example capacitor formed above a top level of interconnect metal, which is passivated and contacted according to a first embodiment of the invention.

Figure 1A:
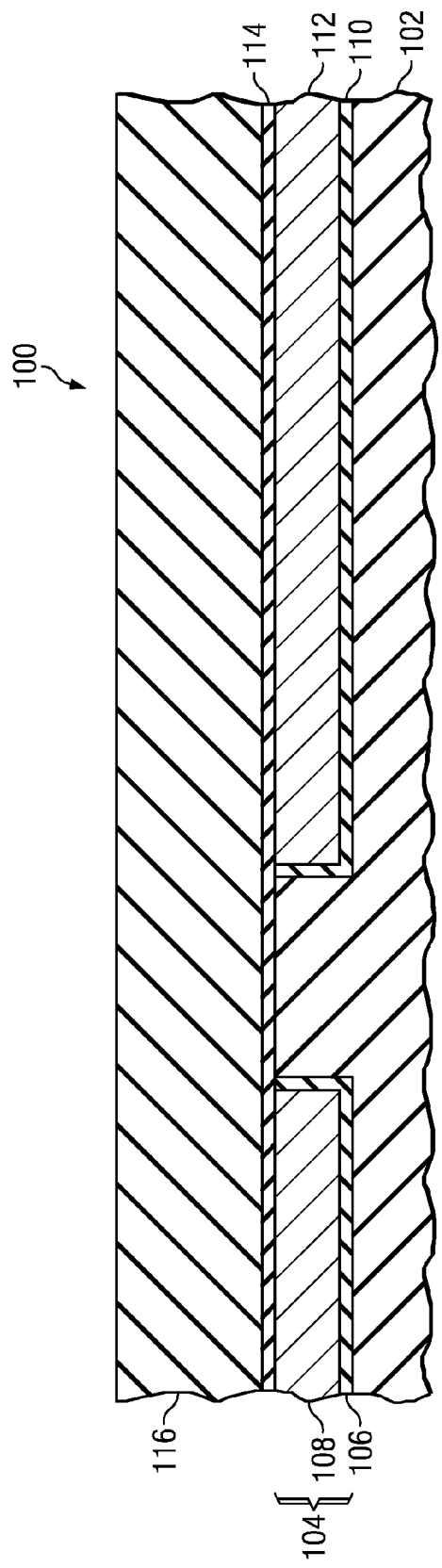
FIGS. 1A-1G are cross-sectional views of an IC with a capacitor formed according to an example embodiment of principles of the invention.

Referring to FIG. 1A, the IC 100 includes a top interlevel dielectric (ILD) layer 102 in which a top level of interconnect metal 104 is formed. A first interconnect element in the top level of interconnect metal 104 includes a first interconnect element liner metal 106 (e.g., tantalum nitride or titanium nitride) which is formed in a trench etched into the top ILD layer 102. A first interconnect element fill metal 108, e.g., copper, is formed on a top surface of the first interconnect element liner metal 106 by known metallization processes, commonly including seed layer deposition, copper plating and copper chemical mechanical polishing (CMP) processes. Similarly, a second interconnect element in the top level of interconnect metal 104 includes a second interconnect element liner metal 110, and a second interconnect element fill metal 112. An optional etch stop layer 114 is formed on top surfaces of the top ILD layer 102, first interconnect element fill metal 108 and second interconnect element fill metal 112. A first layer of protective overcoat 116 (e.g., silicon oxynitride, or possibly silicon dioxide, silicon nitride or other dielectric material) is formed on a top surface of the etch stop layer 114 if present, or on top surfaces of the top ILD layer 102, first interconnect element fill metal 108 and second interconnect element fill metal 112 if no etch stop layer is present. Deposition of the first layer of protective overcoat 116 is e.g., performed by known plasma enhanced chemical vapor deposition (PECVD) processes. The first layer of protective overcoat 116 is e.g., 1 to 3 microns thick. The first and second interconnect elements may also be formed using other materials (e.g., aluminum), and with appropriate other liners, or other metallization schemes.

Figure 1B:
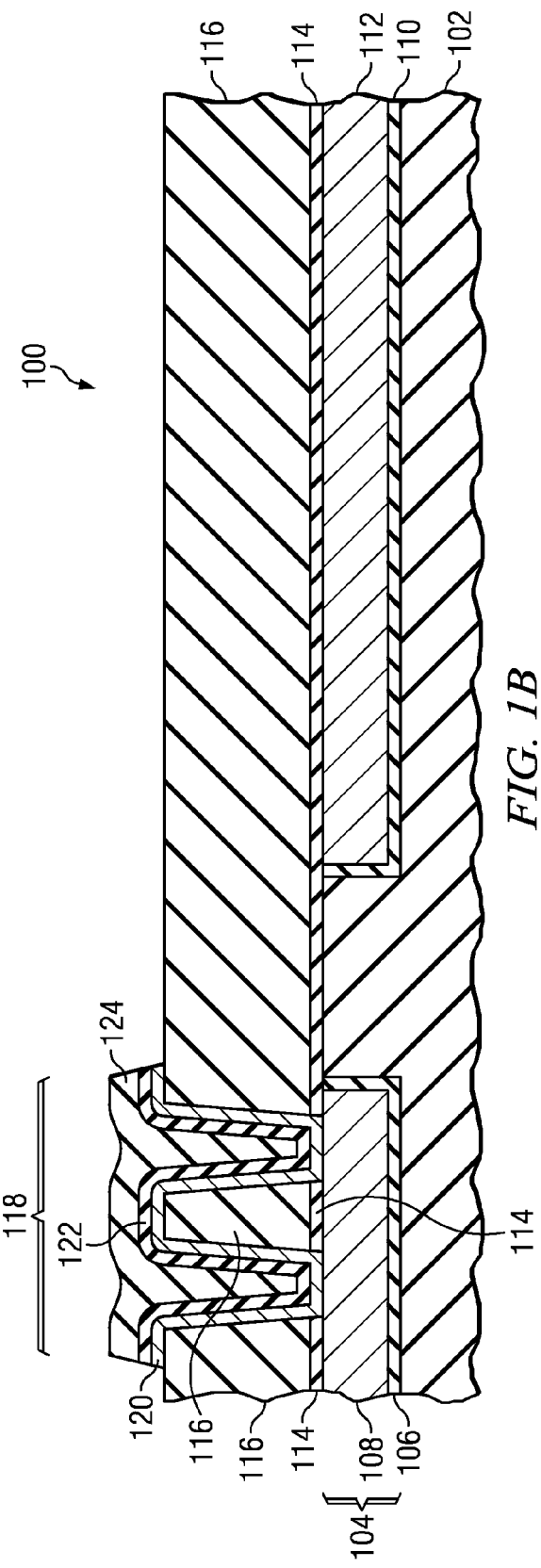

FIG. 1B depicts the IC 100 after formation of a capacitor 118 in the first layer of protective overcoat 116. The capacitor includes a bottom electrode 120, a capacitor dielectric layer 122 and a top electrode 124. In a preferred embodiment, the top electrode 124 is formed of a first electrode metal which provides a conformal layer over the capacitor dielectric layer 122 and a second electrode metal with sufficient thickness to allow etching into the top electrode 124 during a subsequent via etch without damaging the capacitor dielectric layer 122. For example, 5 to 10 nanometers of titanium nitride plus 150 to 200 nanometers of tantalum nitride has been demonstrated to provide a sufficient etch barrier for a via etch process that etches through 2 microns of silicon oxynitride. FIG. 1B depicts the bottom electrode 120 making direct electrical contact to the first interconnect element fill metal 108. The electrical contact may be made to the bottom electrode 120 by any means. Edges of the bottom electrode 120 and top electrode 124 may be passivated to reduce leakage current in the capacitor 118 during operation of the IC 100. The edges of the bottom electrode 120 and top electrode 124 may be configured to have a sloped sidewall profile.

Figure 1C:
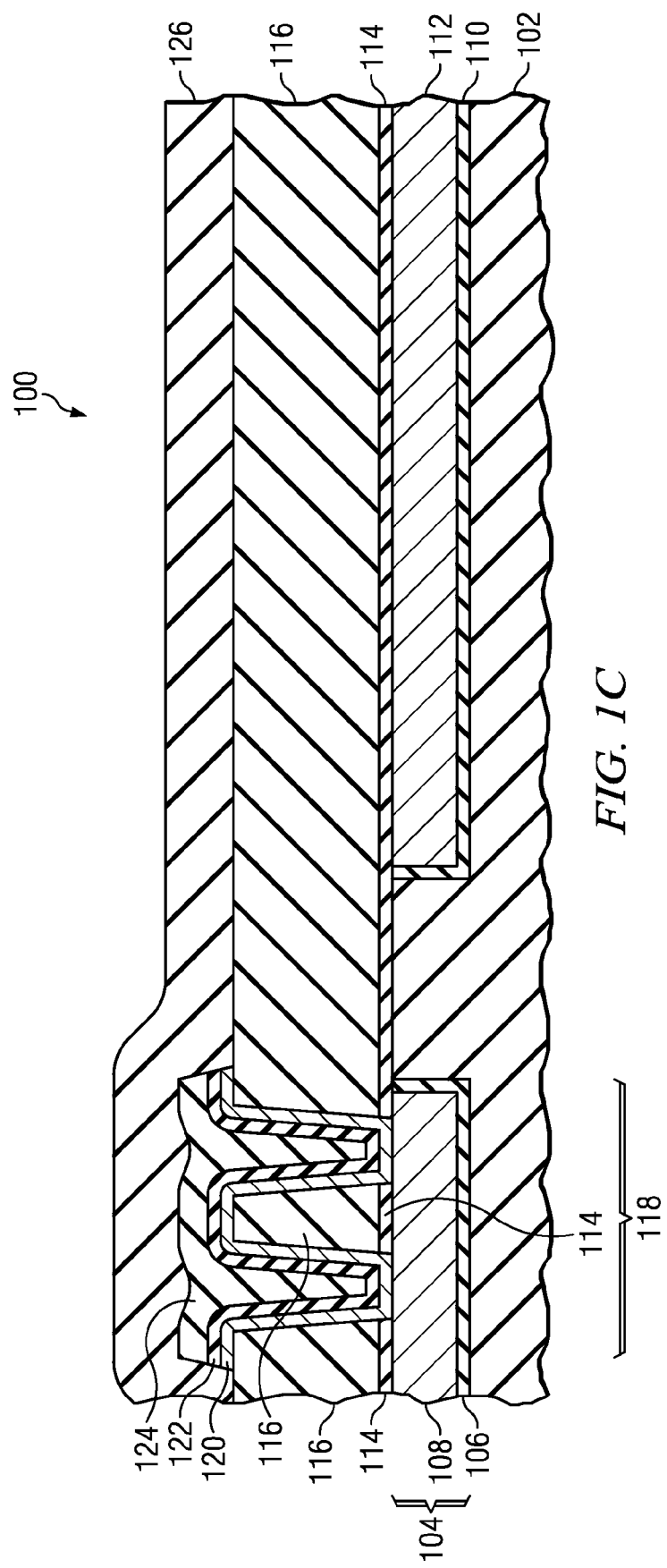

FIG. 1C depicts the IC 100 after deposition of a cap layer of protective overcoat 126 (e.g., preferably 100 to 200 nanometers of silicon nitride deposited by PECVD methods) on a top surface of the first layer of protective overcoat 116, a top surface of the trench capacitor 118, and lateral edges of the bottom electrode 120, the capacitor dielectric layer 122 and the top electrode 124, providing passivation for the capacitor 118. In an alternate embodiment, the protective overcoat cap layer 126 may be a thickness of any dielectric material which provides acceptable passivation for the capacitor 118 and is compatible with the fabrication process sequence of the IC 100.

Figure 1D:
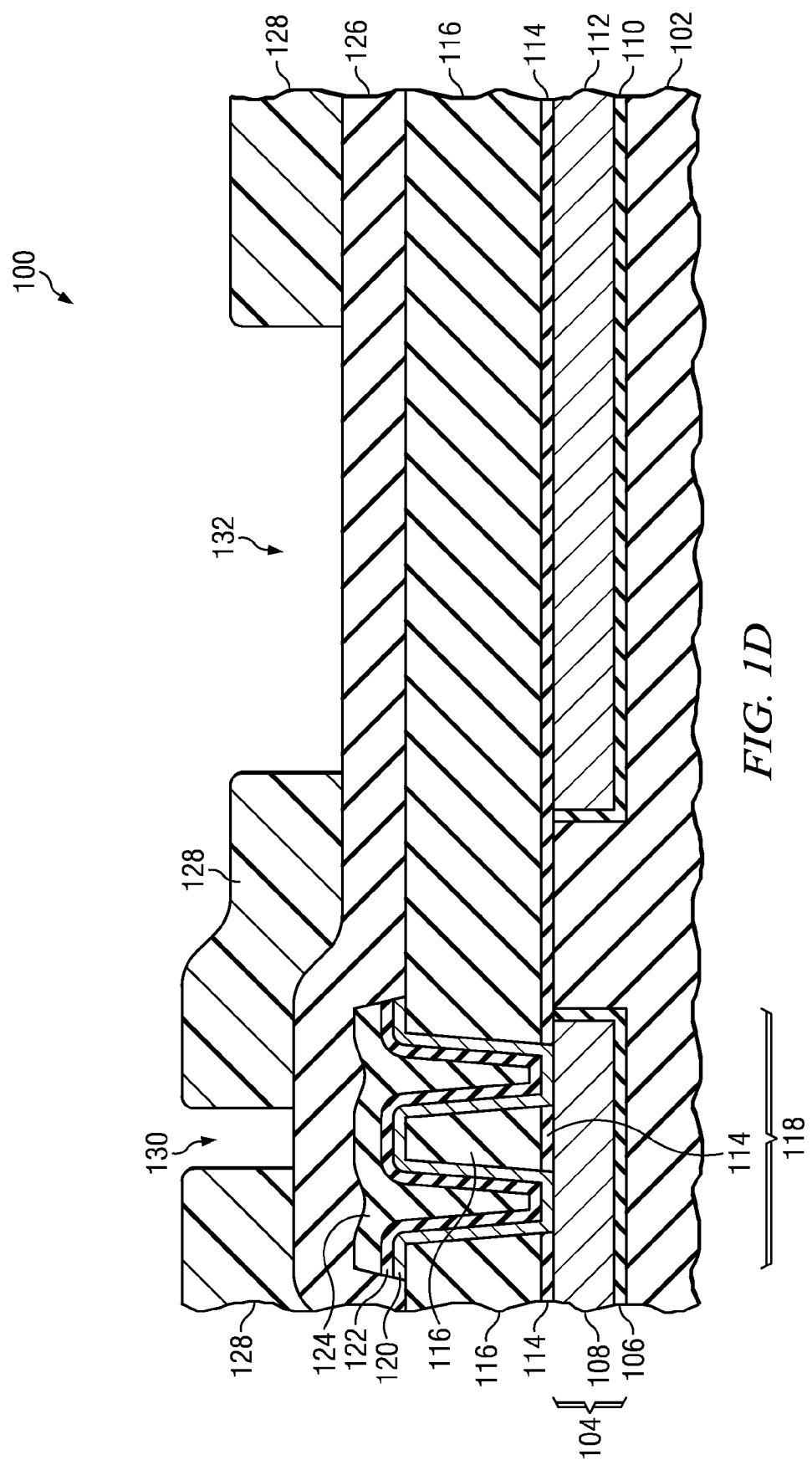

FIG. 1D depicts the IC 100 after a photolithographic process which defines areas for etching bond pad vias. A bond pad via photoresist pattern 128 is formed on a top surface of the cap layer of protective overcoat 126 by photolithographic methods, to expose the top surface of the cap layer of protective overcoat 126 in a capacitor via region 130 over the capacitor 118, and in a bond pad via region 132 over the second interconnect element fill metal 112. The capacitor via region 130 is, e.g., preferably less than 1.5 microns in diameter. The bond pad via region 132 is, e.g., more than 10 microns in diameter.

Figure 1E:
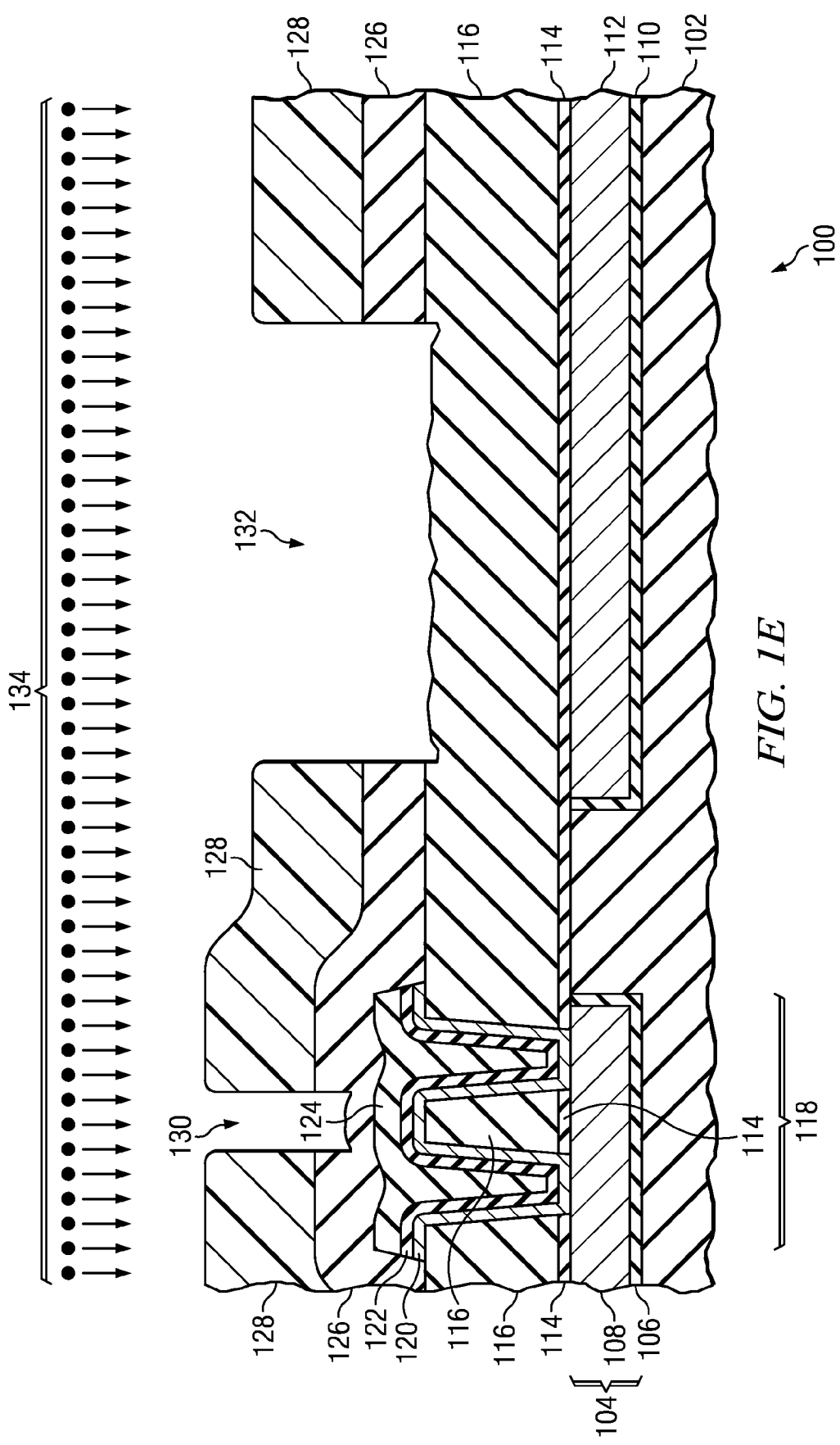

FIG. 1E depicts the IC 100 during a bond pad via etch process to expose the top electrode 124 and second interconnect element fill metal 112. A bond pad via reactive ion etch (RIE) process, which is, e.g., performed in an RIE tool, forms a plasma in a mixture of oxygen and fluorine containing gases and extracts etchant ions 134 (e.g., including fluorine and oxygen) from the plasma and directs the etchant ions 134 to the top surfaces of the bond pad via photoresist pattern 128 and protective overcoat cap layer 126, where the etchant ions 134 remove material from the layer 126 in the capacitor via region 130 and from the layers 116, 126 in the bond pad via region 132, as depicted in FIG. 1D. The bond pad via RIE process is performed so as to etch the material in the layers 116, 126 at a faster rate in the larger bond pad via region 132 than in the smaller capacitor via region 130. For example, an RIE process which provides a gas mixture of argon gas at a flow rate of 250 to 1000 sccm, $O_2$ gas at a flow rate of 5 to 30 sccm, and $C_5F_8$ gas at a flow rate of 5 to 30 sccm, maintains a total pressure between 20 and 200 millitorr, and forms a plasma by inputting 500 to 2500 watts of radio frequency (RF) power into the gas mixture, may etch bond pad vias between 10 and 15 microns in diameter 20 percent faster than capacitor vias between 0.8 and 1.0 microns in diameter, and may etch silicon dioxide more than 10 times as fast as tantalum nitride. The bond pad via photoresist pattern 128 is removed after the bond pad via etch process is completed, such as by exposing the IC 100 to an oxygen containing plasma, followed by a wet clean-up to remove any organic residue from the top surface of the cap layer of protective overcoat 126.

Figure 1F:
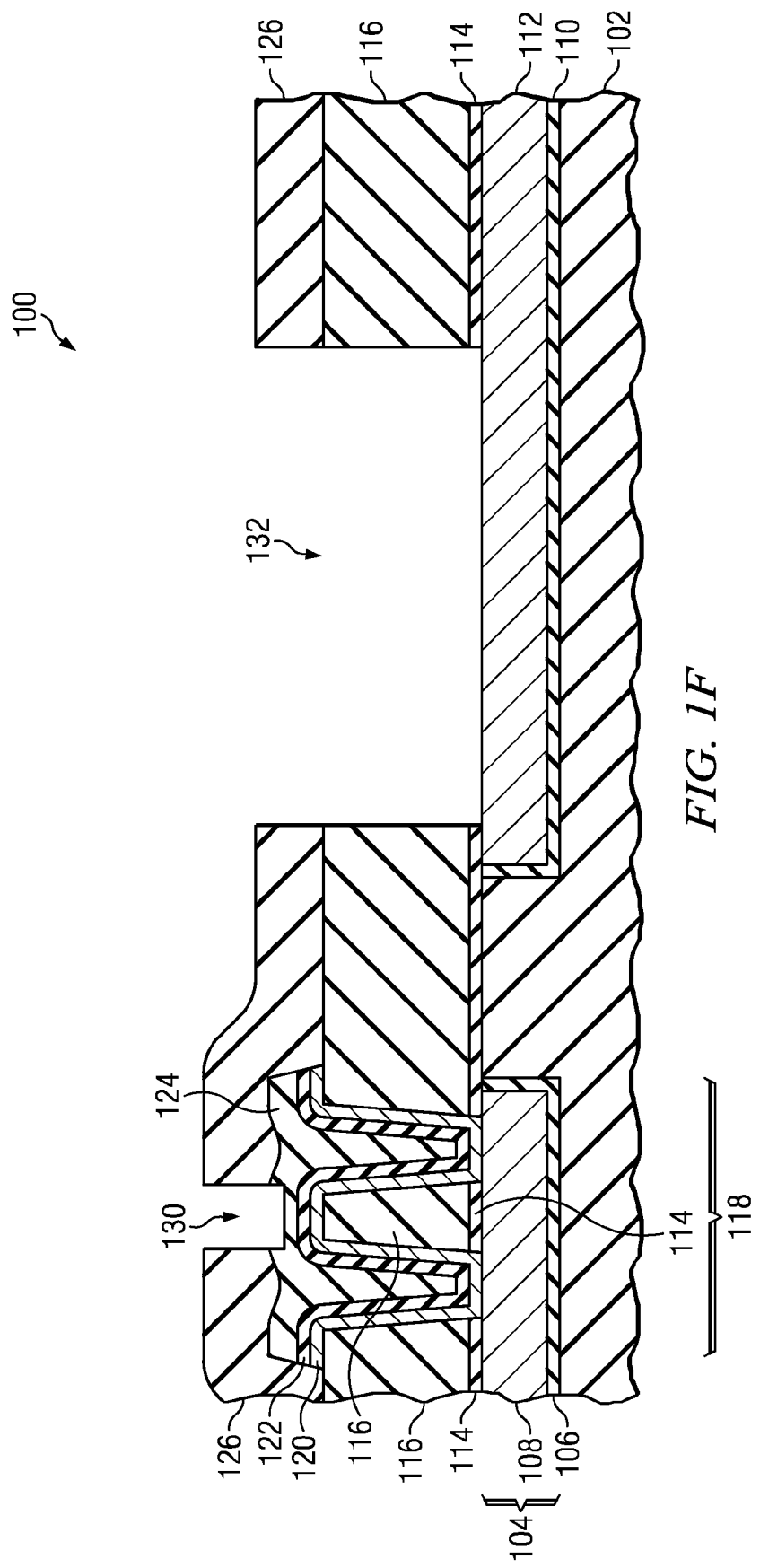

FIG. 1F depicts the IC 100 after the bond pad via etch process is completed. The top electrode 124 is exposed in the capacitor via region 130, and a portion of the top electrode material is removed by the bond pad via etch process. The second interconnect element fill metal 112 is exposed in the bond pad via region 132.

Figure 1G:
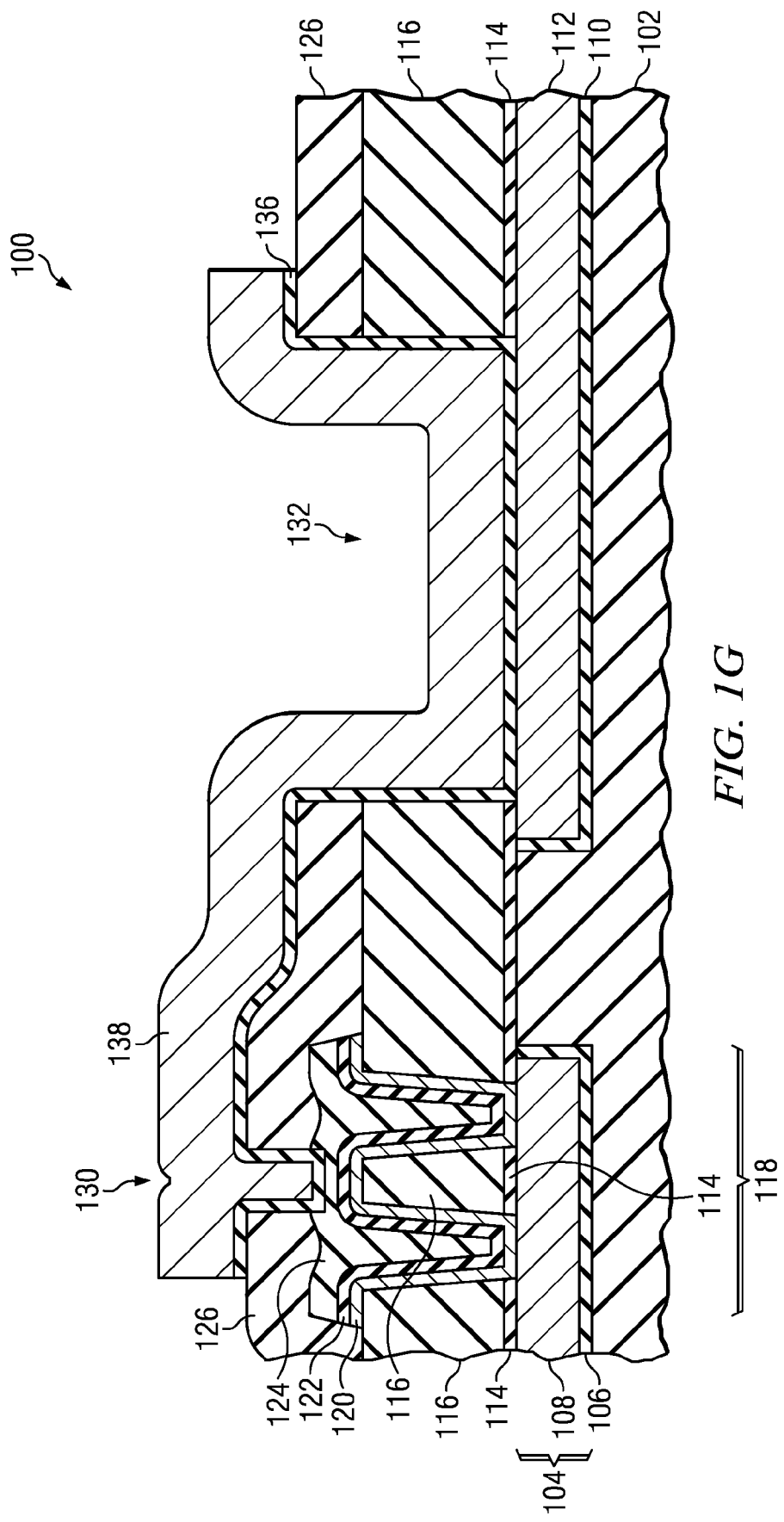

FIG. 1G depicts the IC 100 after formation of a bond pad metallization element that connects the top electrode 124 of the capacitor 118 to the second interconnect element fill metal 112. The bond pad metallization element includes a bond pad liner metal layer 136 deposited on the exposed surfaces of the top electrode 124 and the second interconnect element fill metal 112 and the top surface of the cap layer of protective overcoat 126. The bond pad liner metal layer 136 may, e.g., be 10 to 100 nanometers of tantalum nitride, or possibly titanium tungsten, titanium nitride or other electrically conductive material that exhibits good adhesion to the second interconnect element fill metal 112 and first and cap layers of protective overcoat 116, 126. The bond pad liner metal layer 136 may be deposited by known physical vapor deposition (PVD) methods. The bond pad metallization element also includes a bond pad metal layer 138, e.g., aluminum between 1 and 2 microns thick, deposited on a top surface of the bond pad liner metal layer 136, such as by PVD methods.

The embodiment described above in reference to FIGS. 1A-1G is advantageous because the capacitor 118 is passivated and contacted without adding cost or complexity, such as additional photolithographic operations, to the IC fabrication process sequence.

Those skilled in the art to which the invention relates will appreciate that many other embodiments and modifications are possible within the scope of the claimed invention.

What is claimed is:

1. A method of forming an integrated circuit, comprising:
forming a top level of interconnect metallization;
forming a capacitor, including top and bottom electrodes separated by a capacitor dielectric, over the top level of interconnect metallization;
forming a layer of passivating dielectric material over the top electrode of the capacitor; and
forming: a) an electrical contact to the top electrode, including forming a capacitor via through the layer of passivating dielectric material, concurrently with:
b) a bond pad via through the layer of passivating dielectric material, wherein
i) the capacitor via is etched during the forming at a slower rate than the bond pad, wherein the capacitor via has a smaller region in the integrated circuit than the bond pad, and
ii) an etching of the capacitor via with an etching of the bond pad during the forming is completed for both the capacitor and the bond pad in a single etch;
depositing metal in the capacitor via concurrently with forming bond pad metal in a bond pad metallization process,
wherein the bond pad metal conductively connects the top electrode of the capacitor to the top level of interconnect metallization.

2. The method of claim 1, wherein the top electrode of the capacitor is formed by forming a layer of titanium nitride over a layer of the capacitor dielectric material; and forming a layer of tantalum nitride over the layer of titanium nitride.

3. The method of claim 1, wherein the top electrode is thicker than 150 nanometers.

4. The method of claim 1, wherein the layer of passivating dielectric material comprises silicon nitride.

5. The method of claim 1, wherein the layer of passivating dielectric material is thicker than 150 nanometers.

6. The method of claim 1, wherein the capacitor via has a diameter of less than 2.5 microns.

7. The method of claim 1, wherein the top electrode comprises a layer of titanium nitride and a layer of tantalum nitride.

8. The method of claim 7, wherein the capacitor via has a smaller diameter than the bond pad via.

9. The method of claim 8, wherein the top electrode is thicker than 150 nanometers.

10. The method of claim 9, wherein the layer of passivating dielectric material comprises silicon nitride.

11. The method of claim 10, wherein the layer of passivating dielectric material is thicker than 150 nanometers.

12. The method of claim 11, wherein the capacitor via has a diameter less than 2.5 microns.

13. A method of forming an integrated circuit, comprising:
forming a top level of interconnect metallization;
forming a capacitor, including top and bottom electrodes separated by a capacitor dielectric, over the top level of interconnect metallization;
forming a layer of passivating dielectric material over the capacitor and overlapping edges of the capacitor electrodes; and
forming an electrical contact to the top electrode, including:
masking, in a single masking step, the capacitor via and the bond pad from a single mask;

etching a capacitor via through the passivating dielectric layer to the top electrode concurrently with etching bond pad vias in a bond pad via etch process;

wherein:
i) the capacitor via is etched at a slower rate than the bond pad via, wherein the capacitor via has a smaller region in the integrated circuit than the bond pad, and
ii) the etching of the capacitor via currently with the etching of the bond pad is completed in a single step; and filling the capacitor via with conductive material concurrently with filling the bond pad vias with the same conductive material, wherein the conductive material conductively connects the top electrode of the capacitor to the top level of interconnect metallization.

14. The method of claim 13, wherein the bond pad via etch process etches bond pad vias; the capacitor via is smaller than the bond pad vias; and the bond pad via etch process exhibits a lower etch rate in forming the capacitor via then in forming the bond pad vias.

15. The method of claim 14, wherein the top electrode has a thickness greater than 150 nanometers.

16. The method of claim 1, further comprising a single masking step, the single mask to generate the capacitor via and the bond pad from the single mask in the single step.

17. The method of claim 1, wherein the concurrent etching of the capacitor via is etched at a slower rate than the bond pad via further comprises etching materials in a first layer of protective overcoat and a protective overcoat capacitive layer of the capacitor via than of the bond pad.

18. The method of claim 1, wherein the concurrent etching occurs with a reactive ion etch (RIE).

19. The method of claim 18, wherein the RIE comprises:
a) providing a gas mixture of argon gas at a flow rate of 250 to 1000 sccm,
b) $O_2$ gas at a flow rate of 5 to 30 sccm, and
c) $C_5F_8$ gas at a flow rate of 5 to 30 sccm,
d) maintaining a total pressure between 20 and 200 millitorr, and
e) forming a plasma by inputting 500 to 2500 watts of radio frequency (RF) power into the gas mixture.

20. The method of claim 19, further comprising wherein the capacitor via sizes are between 0.1 um-1 um and the pad via connections are substantially 10 um.

21. The method of claim 19, further comprising etching the bond pad vias which are substantially between 0.1 μm to 1 μm in diameter 20 percent faster than capacitor vias substantially 10 microns in diameter.

22. The method of 19, further comprising etching silicon dioxide of the integrated circuit more than 10 times as fast as tantalum nitride of the integrated circuit.

23. The method of claim 13, wherein the concurrent etching of the capacitor via is etched at a slower rate than the bond pad via further comprises etching materials in a first layer of protective overcoat and a protective overcoat capacitive layer of the capacitor via than of the bond pad.

24. The method of claim 13, wherein the concurrent etching occurs with a reactive ion etch (RIE).

25. The method of claim 24, wherein the RIE comprises:
f) providing a gas mixture of argon gas at a flow rate of 250 to 1000 sccm,
g) $O_2$ gas at a flow rate of 5 to 30 sccm, and
h) $C_5F_8$ gas at a flow rate of 5 to 30 sccm,
i) maintaining a total pressure between 20 and 200 millitorr, and
j) forming a plasma by inputting 500 to 2500 watts of radio frequency (RF) power into the gas mixture.

26. The method of 25, further comprising etching silicon dioxide of the integrated circuit more than 10 times as fast as tantalum nitride of the integrated circuit.

* * * * *